United States Patent
Coleman et al.

(10) Patent No.: US 7,162,676 B2
(45) Date of Patent: Jan. 9, 2007

(54) DATA COMMUNICATION SYSTEM AND METHOD FOR SELECTIVELY IMPLEMENTING FORWARD ERROR CORRECTION

(75) Inventors: Clint S. Coleman, Huntsville, AL (US); Charles E Polk, Jr., Athens, AL (US); Robert A. Barrett, Madison, AL (US)

(73) Assignee: Adtran, Inc., Huntsville, AL (US)

( * ) Notice: Subject to any disclaimer, the term of this patent is extended or adjusted under 35 U.S.C. 154(b) by 517 days.

(21) Appl. No.: 10/668,030

(22) Filed: Sep. 22, 2003

(65) Prior Publication Data

US 2005/0066250 A1 Mar. 24, 2005

(51) Int. Cl.
*H03M 13/00* (2006.01)
*G06F 11/00* (2006.01)
(52) U.S. Cl. ...................... 714/752; 714/704
(58) Field of Classification Search ............... 714/708, 714/704, 752
See application file for complete search history.

(56) References Cited

U.S. PATENT DOCUMENTS

| | | | | |
|---|---|---|---|---|
| 4,998,252 | A | 3/1991 | Suzuki et al. | 714/756 |
| 5,699,365 | A * | 12/1997 | Klayman et al. | 714/708 |
| 5,737,337 | A | 4/1998 | Voith et al. | 714/702 |
| 5,923,642 | A | 7/1999 | Young | 370/206 |
| 6,118,825 | A | 9/2000 | Ikeda et al. | 375/259 |
| 6,278,716 | B1 | 8/2001 | Rubenstein et al. | 370/432 |
| 6,347,075 | B1 | 2/2002 | Barzegar et al. | 370/228 |
| 6,477,669 | B1 * | 11/2002 | Agarwal et al. | 714/708 |
| 6,480,976 | B1 | 11/2002 | Pan et al. | 714/701 |
| 6,683,855 | B1 | 1/2004 | Bordogna et al. | 370/224 |
| 6,700,875 | B1 * | 3/2004 | Schroeder et al. | 370/252 |
| 6,868,520 | B1 * | 3/2005 | Fauconnier | 714/790 |

OTHER PUBLICATIONS

American National Standard for Telecommunications, ANSI T1 413-1998, *Network and Customer Installation Interfaces Asymmetric Digital Subscriber Line (ADSL) Metallic Interface*, Abstract and pp. 25-32.

Polk, et al., "System and Method for Inverleaving Forward Error Correction Code Words Across Multiple Communication Connections," filed Sep. 22, 2003, USPAP 2005/0066249 A1.

* cited by examiner

*Primary Examiner*—Shelly Chase
(74) *Attorney, Agent, or Firm*—Thomas, Kayden, Horstemeyer & Risley, L.L.P.

(57) ABSTRACT

A data communication system comprises a forward error correction (FEC) module, a first transceiver, a second transceiver, and logic. The FEC module is configured to receive data and to define FEC code words based on the received data. The first transceiver is coupled to a first communication line, and the second transceiver is coupled to a second communication line. The logic is configured to selectively enable the FEC module to implement a desired FEC scheme based on an estimated error rate associated with the first communication line and an estimated error rate associated with the second communication line.

19 Claims, 5 Drawing Sheets

DATA COMMUNICATION SYSTEM AND METHOD FOR SELECTIVELY IMPLEMENTING FORWARD ERROR CORRECTION

RELATED ART

In conventional forward error correction (FEC) communication systems, data is often encoded into code words before being transmitted to a receiver at a remote premises. Each code word typically comprises a plurality of characters, and each character usually has the same bit length, although characters of differing bit lengths are also possible. In encoding data into a code word, an encoder typically appends, to the data, additional characters, sometimes collectively referred to as a "checksum." The checksum appended to the data characters within a particular code word comprises redundant information about the data characters, and this redundant information may be used to recover one or more data characters of the code word if part of the code word is corrupted during transmission.

Although FEC corrects for transmission errors occurring on a transmission medium, it also generally decreases the throughput of the transmission medium. In this regard, when FEC techniques are employed to correct for errors occurring on a transmission medium, the transmission of the additional checksum characters consumes a portion of the bandwidth that may otherwise be used to transmit data characters. Thus, employing FEC generally reduces the rate at which data characters may be communicated over the transmission medium. Indeed, in some instances, a desired FEC scheme may reduce the payload data rate of a transmission medium to an unacceptably low level. In such a situation, a less robust FEC scheme that consumes less bandwidth may be employed in lieu of the desired FEC scheme, or the data characters may be transmitted without FEC altogether. In either of the foregoing situations, greater transmission errors are generally encountered as a result of not using the desired FEC scheme.

In some communication systems, a backup line is used to protect communication occurring across a primary line. Normally, data is communicated over the primary line while the backup line remains idle (i.e., does not communicate data). However, if communication over the primary line is interrupted or if the error rate of the primary line becomes significantly degraded, then communication may be switched from the primary line to the backup line. FEC techniques can help to keep the error rate of the primary line within an acceptable range. However, implementing FEC over some primary lines is not feasible due to the reduction in throughput caused by the FEC.

SUMMARY OF THE INVENTION

Generally, embodiments of the present invention provide a data communication system and method for selectively implementing forward error correction.

One exemplary embodiment of the present invention comprises a forward error correction (FEC) module, a first transceiver, a second transceiver, and logic. The FEC module is configured to receive data and to define FEC code words based on the received data. The first transceiver is coupled to a first communication line, and the second transceiver is coupled to a second communication line. The logic is configured to selectively enable the FEC module to implement a desired FEC scheme based on an estimated error rate associated with the first communication line and an estimated error rate associated with the second communication line.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION

The present invention generally relates to forward error correction (FEC) communication systems. In one exemplary embodiment, an FEC transmission system, when desired, uses at least one backup communication line between the FEC transmission system and a remote receiving system to communicate data. The increased bandwidth provided by the backup communication line enables a desired FEC scheme to be applied to the communication occurring between the FEC transmission system and the remote receiving system. However, due to degraded conditions on one of the communication lines, communication over one of the lines may be stopped, and the desired FEC scheme may be dynamically deactivated in an effort to ensure that the data rate between the transmission and receiving systems remains within an acceptable or specified range. Moreover, by selectively applying a desired FEC scheme to communication occurring between the transmitting and receiving systems as described herein, communication between the transmitting and receiving systems may be improved.

Figure 1:
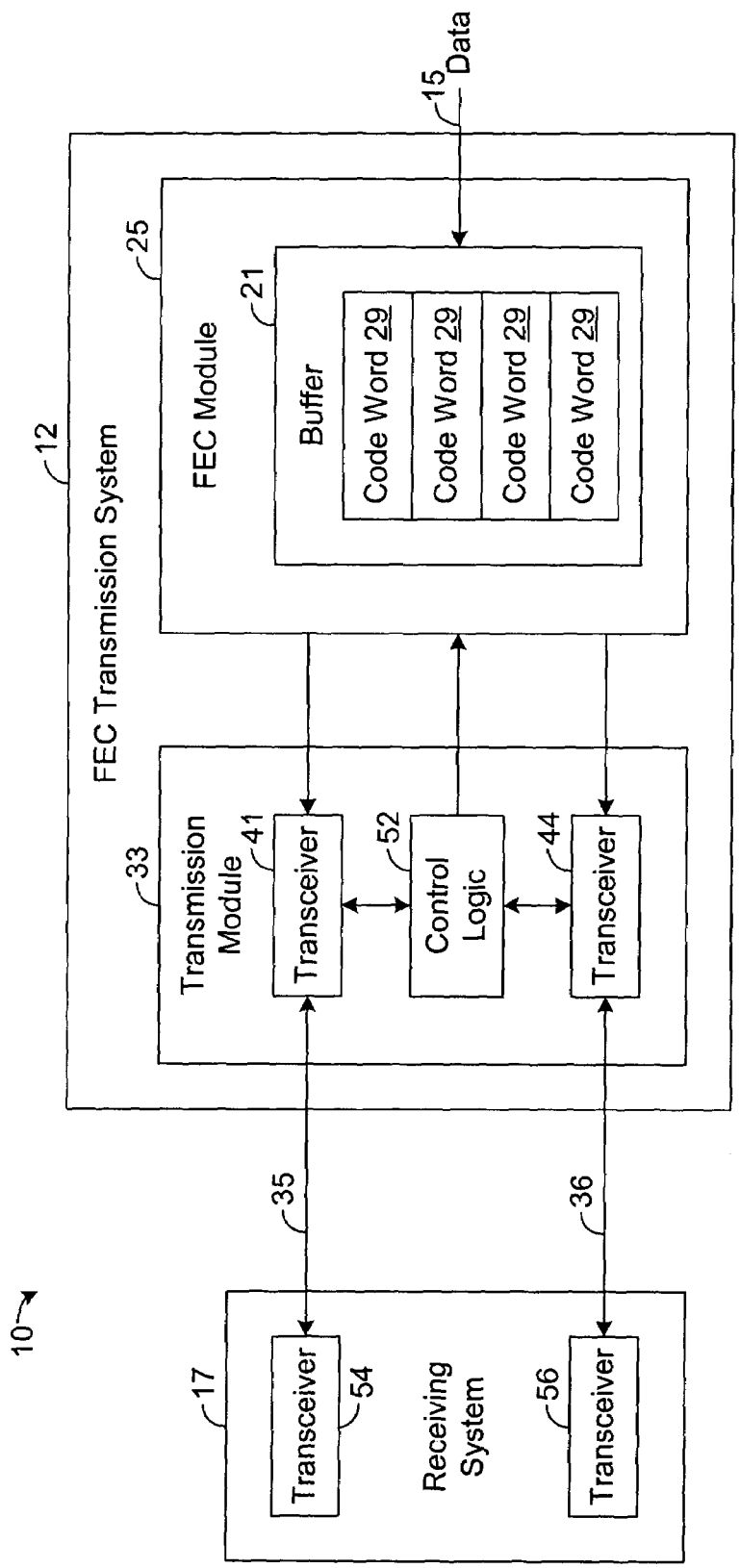
FIG. 1 is a block diagram illustrating an exemplary FEC communication system.

FIG. 1 depicts an exemplary FEC communication system 10 in accordance with one embodiment of the present invention. As shown by FIG. 1, the system 10 comprises an FEC transmission system 12 that receives a stream 15 of data to be transmitted to a receiving system 17, which is remotely located from the FEC transmission system 12. The data from the stream 15, which may also be referred to as "payload data," is temporarily stored within a buffer 21 by an FEC module 25. As will be described in more detail hereafter, the FEC module 25, when desired, defines FEC code words 29 based on the received data stream 15. Such code words 29 will be described in more detail hereinbelow.

A transmission module 33 reads data from the buffer 21 and transmits this data to the receiving system 17. In this regard, the transmission module 33 is communicatively coupled to the receiving system 17 via at least one transmission medium 35, referred to herein as the "primary line," and at least one other transmission medium 36, referred to herein as the "backup line." Each of the lines 35 and 36 may comprise any suitable communication connection that enables the transmission module 33 to communicate with the receiving system 17. Further, it is possible for the lines 35 and 36 to pass through one or more networks (not shown) and/or comprise wired and/or wireless links. As an example, each line 35 and 36 may comprise a digital subscriber line (DSL) sufficient for enabling DSL communication (e.g., HDSL, ADSL, etc.) between the transmission and receiving systems 12 and 17. However, other types of communication connections or links may be used in other embodiments, if desired.

Similar to conventional communication systems, the backup line 36 may be used to backup communication occurring over the primary line 35. Thus, if communication over the primary line 35 fails or is significantly degraded, such communication may be switched to the backup line 36. Until such a switch occurs, the backup line 36 may remain idle (i.e., not be used to communicate data) or may be used as a control channel. In accordance with one novel aspect of the present invention, as will be described in more detail hereinafter, the backup line 36 may also be selectively used to simultaneously communicate FEC code words 29 along with the primary line 35.

As shown by FIG. 1, the transmission module 33 preferably comprises a transceiver for each communication line that may be used to communicate with the receiving system 17. In the exemplary embodiment depicted by FIG. 1 where two communication lines 35 and 36 may be used for such communication, the transmission module 33 comprises one transceiver 41 for communicating over primary line 35 and another transceiver 44 for communicating over backup line 36. However, in other embodiments, additional primary lines and/or backup lines (not shown) for communicating between the systems 12 and 17 may exist. In such embodiments, the transmission module 33 may comprise additional transceivers (not shown) for enabling communication over these additional communication lines.

Similarly, the receiving system 17 preferably comprises a transceiver for each communication line that may be used to communicate between the transmission and receiving systems 12 and 17. In the exemplary embodiment depicted by FIG. 1 where two communication lines 35 and 36 may be used for such communication, the receiving system 17 comprises one transceiver 54 for communicating over primary line 35 and another transceiver 56 for communicating over backup line 36. However, as described above, additional primary lines and/or backup lines (not shown) for communicating between the systems 12 and 17 may exist. In such embodiments, the receiving system 17 may comprise additional transceivers (not shown) for enabling communication over these additional communication lines.

The transmission module 33 also comprises control logic 52 for controlling the transmission of data by the FEC transmission system 12. The control logic 52 may be implemented in hardware, software or a combination thereof FIG. 2 shows an exemplary embodiment of the FEC transmission system 12 where the control logic 52 and the FEC module 25 are both implemented in software and stored within memory 63 of the system 12.

Figure 2:
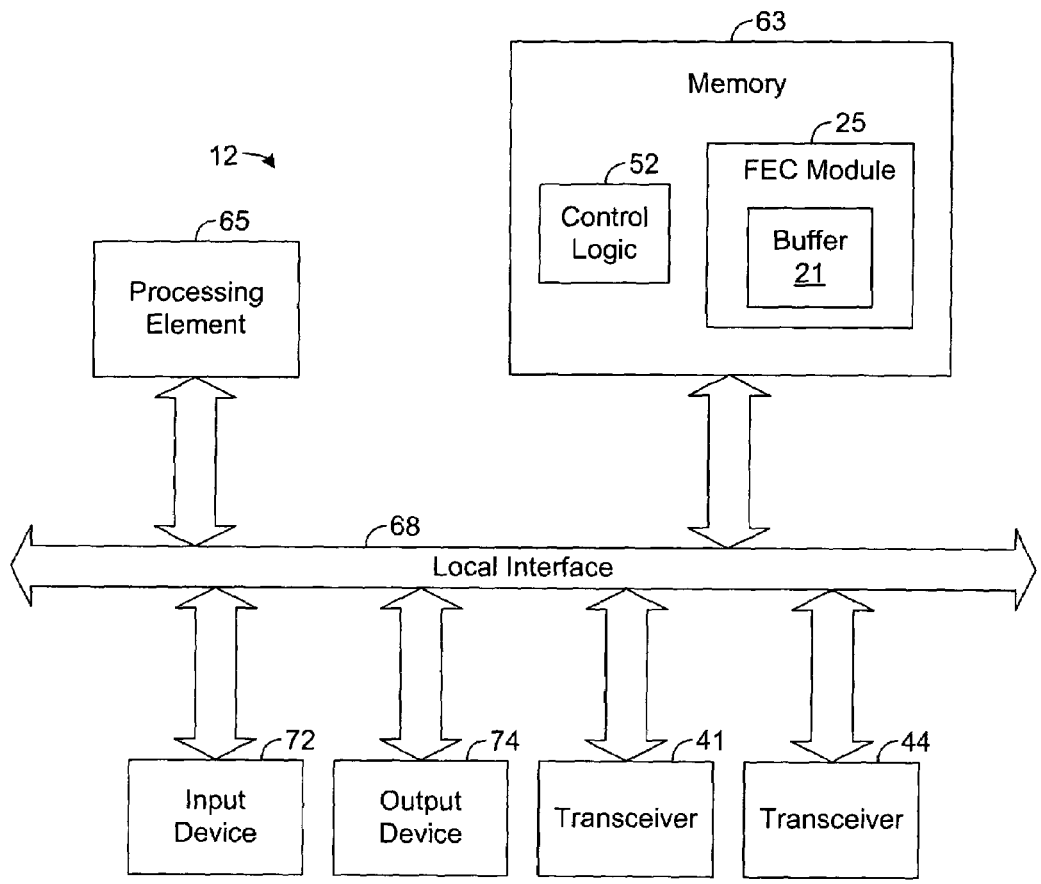
FIG. 2 is a block diagram illustrating an exemplary FEC transmission system depicted in FIG. 1.

The exemplary embodiment of the FEC transmission system 12 depicted by FIG. 2 comprises at least one conventional processing element 65, such as a digital signal processor (DSP) or a central processing unit (CPU), that communicates to and drives the other elements within the system 12 via a local interface 68, which can include at least one bus. Furthermore, an input device 72 can be used to input data from a user of the system 12, and an output device 74 can be used to output data to the user. Note that components of the transceivers 41 and 44 may also be implemented in software. Such software may be executed by the processing element 65, or the transceivers 41 and 44 may comprise one or more DSPs or other type of processing devices separate from the processing element 65 for executing any software of the transceivers 41 and 44.

Note that the transmission module 33 and/or the FEC module 25, when implemented in software, can be stored and transported on any computer-readable medium for use by or in connection with an instruction execution system, apparatus, or device, such as a computer-based system, processor-containing system, or other system that can fetch and execute instructions. In the context of this document, a "computer-readable medium" can be any means that can contain, store, communicate, propagate, or transport a program for use by or in connection with the instruction execution system, apparatus, or device. The computer readable-medium can be, for example but not limited to, an electronic, magnetic, optical, electromagnetic, infrared, or semiconductor system, apparatus, device, or propagation medium. Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 3:
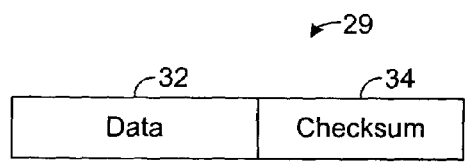
FIG. 3 is a block diagram illustrating a code word formed by an FEC module depicted in FIG. 1.

As shown by FIG. 3, each code word 29 defined by the FEC module 25 of FIG. 1 comprises a data portion 32 and a checksum portion 34. The data portion 32 comprises data characters from the data stream 15. A "character" is a unit of one or more bits of information. In the embodiments specifically described herein, it will be assumed that each character has the same bit length. However, it is possible for different characters to have different bit lengths in other embodiments.

The checksum portion 34 is based on the data portion 32 of the same code word 29, and the characters of the checksum portion 34 define sufficient information for enabling the receiving system 17 (FIG. 1) to recover at least one corrupted character of the data portion 32 via known or future-developed FEC techniques or schemes. In some FEC schemes, the checksum characters of portion 34 represent the result of mathematically or logically combining the data characters of portion 32 of the same code word 32. Thus, if some of the data characters are successfully received by the receiving system 17 (FIG. 1), the system 17 can combine the received data characters with the checksum characters to recover one or more corrupted data characters. The maximum number of data characters of a code word 29 capable of being corrected and, hence, the minimum number of characters of the code word 29 that must be successfully received to enable FEC recovery of the code word 29 depend on the type of FEC scheme being used. Generally, more robust FEC schemes (i.e., FEC schemes that enable a greater number of characters of a single code word 29 to be recovered) have more information in the checksum portion 34. Thus, more robust FEC schemes, while enabling better error correction, also tend to have a more adverse impact on throughput.

Similar to conventional communication systems, the transmission system 12 may be configured to transmit data from the data stream 15 over the primary line 35 while the backup line 36 is used to backup such communication. In such a mode of operation, referred to hereafter as the "backup mode," the backup line 36 could remain idle or, alternatively, be used as a control channel. Furthermore, as will be described in more detail hereinafter, the FEC module 25, when enabled, is configured to encode the data from the stream 15 with checksum information according to a desired FEC scheme. However, inserting the checksum information into the data stream being communicated over the primary line 35 may cause a data rate (e.g., the rate at which payload data is transmitted) of the primary line 35 to fall below an acceptable or specified level. Thus, in an effort to keep the payload data rate of the system 10 within an acceptable or specified range, the control logic 52 may be configured to disable the FEC module 25 when the system 10 is operating in the backup mode.

In another mode of operation, referred to hereafter as the "FEC mode," the transmission system 12 is configured to employ the desired FEC scheme and to use the backup line 36, in addition to the primary line 35, to transmit data to the receiving system 17. In such a mode of operation, the additional bandwidth provided by the backup line 36 is preferably sufficient to enable the overall payload data rate of the system 10 (i.e., the sum of the payload data rates of the primary and backup lines 35 and 36) to remain in the aforedescribed acceptable or specified range. Further, by employing the desired FEC scheme, the quality of the communication occurring between the transmission and receiving systems 12 and 17 may be improved.

To determine which mode of operation is to be implemented, the control logic 52 may estimate or otherwise determine the error rates associated with both modes of operations. In this regard, the control logic 52 determines an error rate (the "backup mode error rate") of communicating over the primary line 35 without employing the desired FEC scheme, and the control logic 52 determines the error rate (the "FEC mode error rate") of communicating over the primary and backup lines 35 and 36 while employing the desired FEC scheme. Note that an error rate of a communication line generally refers to the number of corrupted and unrecoverable data characters received from the line per unit of time.

The control logic 52 compares the backup mode error rate to the FEC mode error rate to determine which of the modes of operations is optimal. The control logic 52 then controls the FEC transmission system 12 such that the more optimal mode of operation is implemented. Note that if the transmission quality of the backup line 36 is relatively good (e.g., relatively few transmission errors occur on the backup line 36), then it is likely that the FEC mode will be optimal. However, if the transmission performance of the backup line 36 is degraded, then the backup mode may be optimal.

For example, it is possible for the backup line 36 to introduce a sufficiently high number of errors such that the error rate of transmitting data to the receiving system 17 is lower for the backup mode as compared to the FEC mode even though the desired FEC scheme is not employed in the backup mode. In such a case, the control logic 52 preferably disables the FEC module 25 from encoding the data stream 15 with checksum information and causes the transmission system 12 to transmit the data from this stream 15 in the backup mode of operation.

Note that the above description assumes that the primary line 35 has an error rate that is equal to or lower than the error rate of the backup line 36. In this regard, if the error rate of the line 35 falls below that of the backup line 36, then the designation of the lines may be switched such that line 36 is considered to be the "primary line" (and, therefore, used to communicate data in the backup mode) and line 35 is considered to be the "backup line."

It should also be noted that, in order to reduce the FEC mode error rate, it may be desirable to set the aggregate data rates (i.e., the data rate of payload and non-payload data) of transceivers 41 and 44 to a level below the aggregate data rate of the transceiver 41 in the backup mode. In this regard, it is generally well-known that communicating over a communication line at a lower aggregate data rate tends to reduce the number of errors occurring on the line. Thus, if desired, the additional bandwidth provided by the backup line 36 may, in addition to enabling the desired FEC scheme, may also be used to improve the overall error rate of the communication system 10 when the system 10 is operating in the FEC mode.

There are a variety of methodologies and factors that may be used to determine which mode of operation is the most optimal and should be implemented. Exemplary techniques for selectively choosing and implementing an optimal mode of operation for the communication system 10 will now be described in more detail hereafter.

When the FEC transmission system 12 begins to receive, from stream 15, payload data to be transmitted to the receiving system 17, the transmission module 33 establishes a communication session with the receiving system 17 over at least primary line 35. The control logic 52 then determines values indicative of the communication performance of the lines 35 and 36 and, based on such values, determines whether to communicate in the backup mode or the FEC mode.

In particular, the control logic 52 estimates or otherwise determines the backup mode error rate and the FEC mode error rate, as described above. Known or future-developed techniques for estimating the error rates associated with communication occurring across communication lines may be employed to estimate the backup mode error rate and the FEC mode error rate. For example, in conventional systems, the error rate of a communication line may be estimated by transmitting a known sequence of characters over the communication line and then determining the number of corrupted characters within the received sequence. Such techniques may be employed to determine the error rates of the primary and backup lines 35 and 36. Note that the backup mode error rate may correspond to the error rate of the primary line 35. Further, the FEC mode error rate may correspond to the sum of the error rates of the primary and backup lines 35 and 36. Furthermore, the FEC mode error rate may be adjusted to account for improvements that would be realized by the introduction of the desired FEC scheme.

As an example, to determine the FEC mode error rate, the control logic 52 may be configured to estimate or otherwise determine the error rates of communicating over primary and backup lines 35 and 36 by transmitting known sequences over the lines 35 and 36 without using or, in other words, independent of any FEC schemes. Then, the control logic 52 may reduce such error rates by an amount corresponding to the number of errors that would have likely been corrected if the desired FEC scheme would have been used to communicate the foregoing sequences. For example, if x number of errors were detected in a data sequence transmitted over backup line 36, then the control logic 52, when determining the FEC mode error rate, may reduce x by the number of errors that would have likely been corrected by the desired FEC scheme, if such scheme would have been used to communicate the data sequence. Similar techniques may also be employed when estimating the error rate of the primary line 35 for determining the FEC mode error rate.

However, it should be noted that the aforementioned techniques for determining the backup mode error rate and FEC mode error rate are presented for illustrative purposes, and other techniques may be used to determine such error rates. For example, the FEC mode error rate may be estimated by placing the FEC transmission system 12 in the FEC mode of operation and then estimating and summing the error rates of the primary and backup lines 35 and 36.

If the FEC mode error rate is not less than the backup mode error rate, then the control logic 52 causes the FEC transmission system 12 to operate in the backup mode. In this regard, the control logic 52 enables the transceiver 41 that communicates over the primary line 35 and disables the transceiver 44 that communicates over the backup line 36. The control logic 52 also disables the FEC module 25. When disabled, the FEC module 25 refrains from employing the desired FEC scheme to encode the payload data from stream 15, thereby preventing the FEC module 25 from inserting checksum information into the payload data to be transmitted to the receiving system 17. Moreover, the FEC module 25 simply buffers the data stream 15 and allows this buffered data to pass through, unaffected, to the enabled transceiver 41. Thus, the desired FEC scheme is not implemented. As a result, all of the payload data from the stream 15 is transmitted over the primary line 35 while the line 36 is used as a backup in the event that communication over the primary line 35 becomes significantly degraded such that a backup switch is initiated.

If the FEC mode error rate is less than the backup mode error rate, then the control logic 52 causes the FEC transmission system 12 to operate in the FEC mode instead of the backup mode. In this regard, the control logic 52 enables both transceivers 41 and 44, as well as the FEC module 25. When enabled, the FEC module 25 employs the desired FEC scheme to encode the payload data from stream 15, thereby defining FEC code words 29 to be transmitted to the receiving system 17. In this regard, the FEC module 25 defines checksum information based on the payload data received from the stream 15 and inserts this checksum information into the payload data. Further, the FEC module 25 buffers the code words 29 via buffer 21, and each enabled transceiver 41 or 44 reads the buffered data and transmits this data to the receiving system 17.

To enhance error correction, the FEC module 25 preferably interleaves the code words 29 such that the code words 29 read and transmitted by each transceiver 41 or 44 are interleaved across the same communication line 35 or 36. In this regard, the FEC module 21 interleaves the code words 29 such that each of a plurality of characters of the same code word 29 are separated by at least one character of another code word 29 during transmission over one of the lines 35 or 36. Such interleaving helps to enhance the ability of the receiving system 17 to recover characters corrupted by impulse noise on the communication line 35 or 36 being used to communicate the foregoing characters. Techniques for performing such interleaving are described in more detail in commonly-assigned U.S. patent application Ser. No. 10/626,022, entitled "System and Method for Interleaving and Transmitting Forward Error Correction Code Words," which is incorporated herein by reference.

In addition to the aforedescribed interleaving, the FEC module 25 also preferably interleaves the code words 29 across multiple lines 35 and 36. In this regard, the FEC module 25 ensures that at least a portion of each code word 29 is transmitted over primary line 35 and that another portion of the same code word 29 is transmitted over backup line 36. Such interleaving further helps to enhance the ability of the receiving system 17 to recover characters corrupted by impulse noise on the communication lines 35 and 36. Techniques for performing the foregoing interleaving are described in more detail in commonly-assigned U.S. patent application Ser. No. 10/667,942, entitled "System and Method for Interleaving Forward Error Correction Code Words Across Multiple Communication Connections," and filed concurrently herewith, which is incorporated herein by reference.

Although the interleaving described hereinabove helps the communication system 10 to better withstand impulse noise, it is not necessary for the FEC module 25 to perform any such interleaving. Indeed, in other embodiments, the transmission system 12 may transmit each code word 29 as a string of characters over the same communication line 35 or 36, if desired.

It should be noted that, after selecting and implementing one of the aforedescribed modes of operation, the control logic 52 may continue monitoring the performance of lines 35 and 36 and also perform a mode switch if such a switch is desirable. As an example, the control logic 52 may initially determine that the estimated FEC mode error rate is lower than the estimated backup mode error rate. Thus, the control logic 52 may initially cause the FEC transmission system 12 to operate in the FEC mode. However, during the same communication session, the control logic 52 may determine that the estimated FEC mode error rate has risen above the estimated backup mode error rate. Such a situation may arise if the communication performance of backup line 36 becomes significantly degraded. In response to a determination that the backup mode error rate is lower than the FEC mode error rate, the control logic 52 may initiate a mode switch, thereby switching the mode of operation of the FEC transmission system 12 into the backup mode.

In another example, the control logic 52 may initially determine that the estimated FEC mode error rate is higher than the estimated backup mode error rate. Thus, the control logic 52 may initially cause the FEC transmission system 12 to operate in the backup mode. However, during the same communication session, the control logic 52 may determine that the estimated FEC mode error rate has fallen below the estimated backup mode error rate. Such a situation may arise if the communication performance of backup line improves during the communication session. In response to a determination that the backup mode error rate is higher than the FEC mode error rate, the control logic 52 may initiate a mode switch, thereby switching the mode of operation of the FEC transmission system 12 into the FEC mode.

Figure 4:
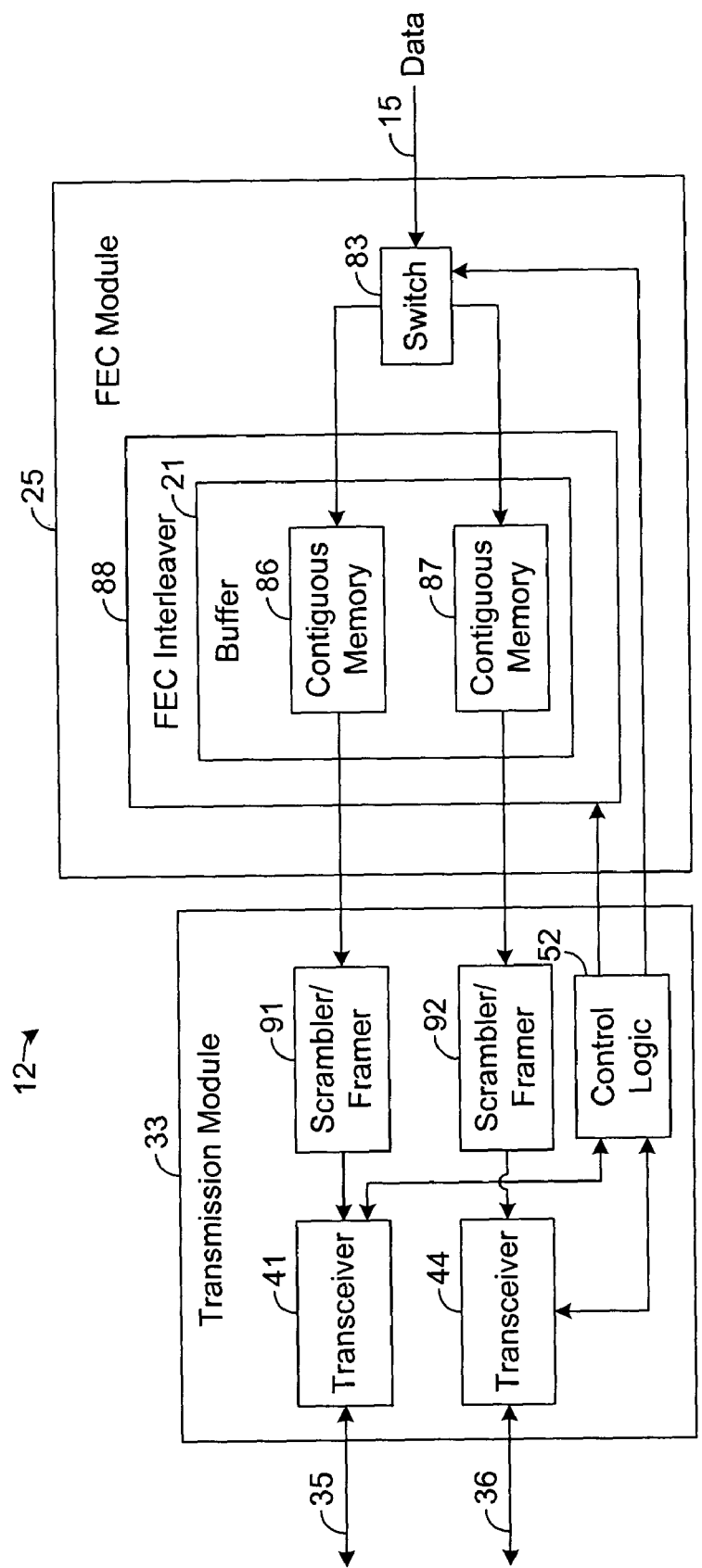
FIG. 4 is a block diagram illustrating a detailed view of an exemplary FEC transmission system depicted in FIG. 1.

FIG. 4 depicts an exemplary embodiment of an FEC transmission system 12 that may be used to implement the aforedescribed functionality. As shown by FIG. 4, the data stream 15 is received by a switch 83, which is controlled by the control logic 52. Based on control signals from the control logic 52, the switch 83 directs each data character to contiguous memory 86 or 87 within the buffer 21. In the backup mode, the control logic 52 controls the switch 83 such that each data character from data stream 15 is directed to and stored in contiguous memory 86. However, in the FEC mode, the control logic 52 controls the switch 83 such that portions of the data stream 15 are directed to contiguous memory 86 and other portions of the data stream 15 are directed to contiguous memory 87. For example, the switch 83 may direct every other data character to the same set of contiguous memory 86 and 87. In such an example, successive data characters from the stream 15 are transmitted to and stored in different sets of contiguous memory 86 and 87.

As shown in FIG. 4, the FEC module 25 comprises an FEC interleaver 88. When the FEC module 25 is enabled (i.e., when the system 12 is operating in the FEC mode), the FEC interleaver 88 implements a desired FEC scheme. Thus, the FEC interleaver 88 defines checksum characters based on the data characters received from switch 83 and inserts such checksum characters into the contiguous memory 86 and 87 along with the data characters from stream 15. Further, the FEC interleaver 88 interleaves the data characters and the checksum characters such that each successive character read out of the contiguous memory 86 for transmission to receiving system 17 (FIG. 1) is associated with a different code word 29 (FIG. 1) and such that each successive character read out of the contiguous memory 87 for transmission to receiving system 17 is also associated with a different code word 29.

A scrambler/framer 91 of the transmission module 33 reads the characters stored in the contiguous memory 86 when the transceiver 41 is enabled by the control logic 52. Via known or future-developed techniques, the scrambler/framer 91 scrambles and frames such data for transmission by the transceiver 41. The scrambled and framed data is then transmitted to the transceiver 41, which transmits such data over the primary line 35.

Similarly, a scrambler/framer 92 of the transmission module 33 reads the characters stored in the contiguous memory 87 when the transceiver 44 is enabled by the control logic 52. Via known or future-developed techniques, the scrambler/framer 92 scrambles and frames such data for transmission by the transceiver 44. The scrambled and framed data is then transmitted to the transceiver 44, which transmits such data over the backup line 36.

By defining checksum characters and inserting these checksum characters into the payload data buffered by the buffer 21, as described above, the FEC interleaver 88 enables the receiving system 17 (FIG. 1) to recover corrupted characters according to the desired FEC scheme implemented by the FEC interleaver 88. An exemplary configuration and operation of the receiving system 17 will be described in more detail hereinbelow.

Note that, in the backup mode, each character of the data stream 15 is directed to the contiguous memory 86 by the switch 83. Further, the FEC module 25 is disabled by the control logic 52, and the FEC interleaver 88, therefore, refrains from defining checksum characters. Thus, the data stream 15 effectively passes through the FEC interleaver 88 without change. The data characters from this stream 15 are then scrambled and framed by the scrambler/framer 91 before being transmitted over the primary line 35 by the transceiver 41. In such a mode of operation, the desired FEC scheme is not implemented.

Also note that, in the backup mode, it is possible for the transmission system 12 to transmit data from the stream 15 to the receiving system 17 without employing any type of FEC scheme. However, in alternative embodiments, it is possible for the FEC transmission system 12 to employ a different FEC scheme in the backup mode. For example, the FEC transmission system 12 may be configured to employ an FEC scheme that is less robust and less detrimental to the payload data rate of primary line 35 as compared to the desired FEC scheme that is disabled during the backup mode. However, employing an FEC scheme during the backup mode is not necessary for implementing the present invention.

Figure 5:
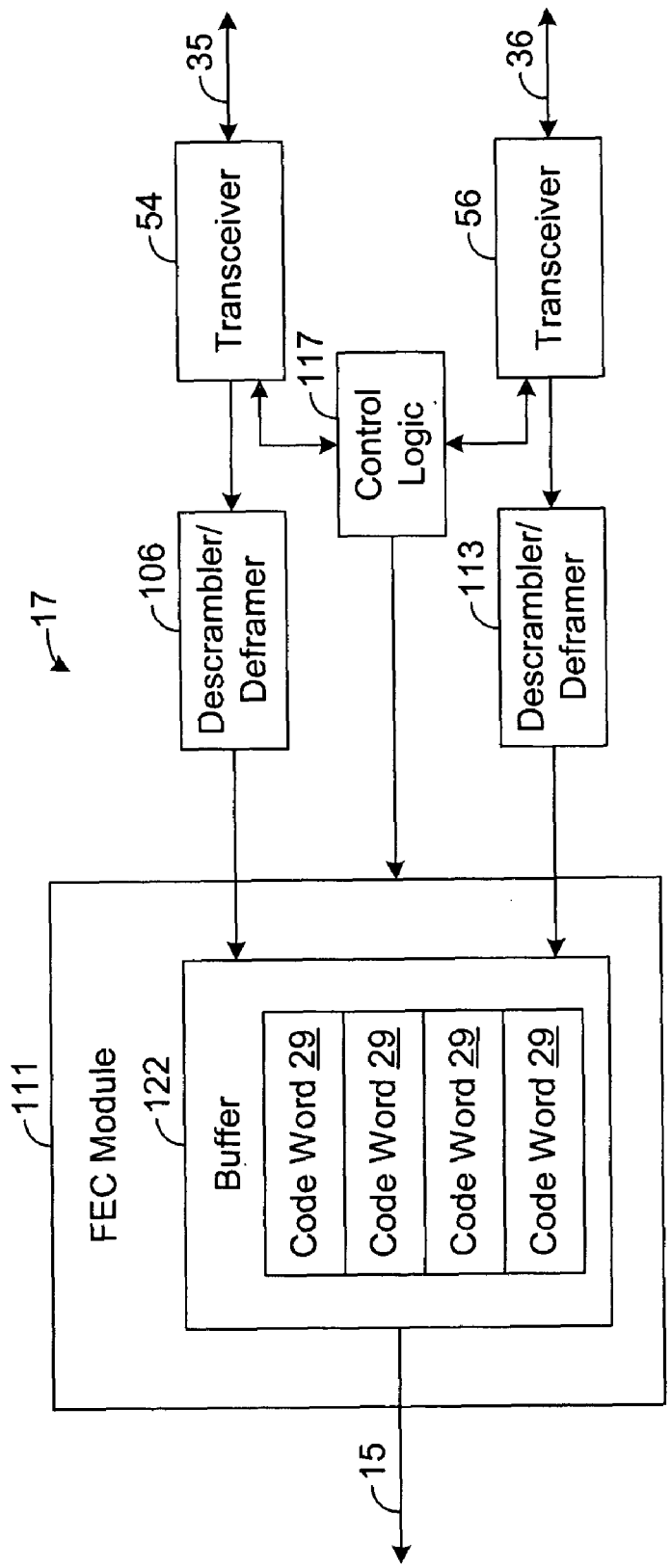
FIG. 5 is a block diagram illustrating an exemplary receiving system depicted in FIG. 1.

FIG. 5 depicts an exemplary embodiment of the receiving system 17. Data transmitted over primary line 35 is received by the transceiver 54, which passes this data to a descrambler/deframer 106. Via known or future-developed techniques, the descrambler/deframer 106 descrambles and deframes the received data before passing such data to an FEC module 111.

Similarly, data transmitted over backup line 36 is received by the transceiver 56, which passes this data to a descrambler/deframer 113. Via known or future-developed techniques, the descrambler/deframer 113 descrambles and deframes the received data before passing such data to the FEC module 111.

The receiving system 17 may also comprise control logic 117, which may be implemented in hardware, software, or any combination thereof. The control logic 117 preferably communicates over one of the lines 35 or 36 or over one or more separate lines (not shown) with the control logic 52 (FIG. 4) of the transmission system 12 to determine the current mode of operation. Note that the control logic 52 may generate information indicative of which mode of operation is to be implemented and communicate such information to control logic 117. In addition, control logic 117 may generate information indicative of which mode of operation is to be implemented via techniques described herein and then communicate such information to the control logic 52. Indeed, any of the steps described herein for selecting a desired mode of operation, such as, for example, estimating error rates or comparing error rates, may be implemented by either the control logic 52 or the control logic 117.

As an example, once a communication session is established between the transmission module 33 and the receiving system 17, each of the transceivers 41 and 44 may transmit a known sequence of characters over the lines 35 and 36, respectively. Based on the number of uncorrupted characters received by each of the transceivers 54 and 56, the control logic 117 of the receiving system 17 may estimate the error rates of lines 35 and 36 and then communicate information indicative of these estimated error rates to the control logic 52 of the FEC transmission system 12. Such information may be communicated across a control channel between the transceivers 41 and 54 and/or a control channel between the transceivers 44 and 56. Based on the foregoing information, the control logic 52 may then determine the backup mode error rate and the FEC mode error rate and, using such error rates, may determine the optimal mode of operation for the FEC transmission system 12 according to the techniques described hereinabove.

When operating in the backup mode, the control logic 117 disables the transceiver 56 coupled to the backup line 36 and enables the transceiver 54 coupled to the primary line 35. The control logic 117 also disables the FEC module 111. When disabled (i.e., in the backup mode), the FEC module 111 allows the data from the descrambler/deframer 106 to pass through without change and, therefore, outputs the same data stream 15 originally received by the transmission system 12 (FIG. 4). If desired, the FEC module 111 may buffer such data in a buffer 122.

When enabled (i.e., in the FEC mode), the FEC module 111 recovers and buffers, in buffer 122, the code words 29 defined by the FEC module 25 (FIG. 4). The FEC module 111 preferably rearranges the data received from the communication lines 35 and 36, as appropriate, to output the data stream 15 originally received by the transmission system 12 (FIG. 4). However, before outputting the data buffered by the FEC module 111, the FEC module 111 attempts to recover any corrupted characters according to the desired FEC scheme implemented by the FEC transmission system 12.

An exemplary operation and functionality of the FEC transmission system 12 will now be described with particular reference to FIG. 6.

Assume that the FEC transmission system 12 is configured to implement a desired FEC scheme, such as a Reed-Solomon error correcting scheme, for example, only when in the FEC mode. Further assume that the FEC transmission system 12 of FIG. 1 begins to receive payload data from stream 15 to be transmitted to the receiving system 17. Initially, the control logic 52 places the transmission system 12 in the backup mode and causes the system 12 to establish a communication session with the receiving system 17, as shown by block 205 of FIG. 6. In this regard, the control logic 52 enables transceiver 41 and disables the FEC module 25 and the transceiver 44. Thus, the system 12 begins to transmit the payload data from stream 15 over primary line 35 without implementing the desired FEC scheme. In particular, payload data from the stream 15 is buffered by and passes through the FEC module 25. The transceiver 41 reads the data buffered by the FEC module 25 and transmits this data to transceiver 54.

In blocks 211 and 212, the control logic 52 determines whether either of the communication lines 35 or 36 has failed. Such a condition may arise when one of the lines 35 or 36 is cut or otherwise affected such that communication over the line 35 or 36 is not possible. If the backup line 36 has failed, the control logic 52 transmits a warning message, as shown by block 215, and continues to transmit over the primary line 35, as shown by block 216. Such a message may be transmitted to a network administrator who may dispatch a technician for evaluating the status of the backup line 36. The communication of such a warning message is not an important aspect of the present invention and may be omitted, if desired.

If the primary line 35 has failed, the control logic 52 performs a line switch, as shown by block 218, such that the designation of lines 35 and 36 is reversed. In the example where line 35 is presently designated as "primary" and line 36 is presently designated as "backup," the control logic 52 changes the designation of line 35 to "backup" and the designation of line 36 to "primary." Thus, the control logic 52 enables transceiver 44 and disables transceiver 41 such that data from the stream 15 is transmitted by transceiver 44 instead of transceiver 41 in block 216.

If there is no line failure detected in blocks 211 and 212, then the control logic 52 determines the error rate ($E_{primary}$) of the primary line 35 and the error rate ($E_{backup}$) of the backup line 36, as shown by block 224, while in the backup mode (i.e., without implementation of the desired FEC scheme). The control logic 52 also determines the error rate ($E_{FEC}$) of communicating over both primary and backup lines 35 and 36, as shown by block 225, assuming that the desired FEC scheme is being implemented. $E_{FEC}$ may be determined by summing $E_{primary}$ and $E_{backup}$ and then reducing the summed error rate to account for the reduction in errors realized by implementing the desired FEC scheme to communicate over lines 35 and 36.

As shown by block 228, the control logic 52 compares $E_{backup}$ to $E_{primary}$. If $E_{backup}$ is not less than $E_{primary}$, then the control logic 52 compares $E_{primary}$ to $E_{FEC}$, as shown by block 232. If $E_{primary}$ is not less than $E_{FEC}$, then it is desirable for the transmission system 12 to communicate in the FEC mode instead of the backup mode. Thus, if a "no" determination is made in block 232, the control logic 52 enables both transceivers 41 and 44 and also enables the FEC module 25 such that the system 12 communicates with the receiving system 17 over both lines 35 and 36 while implementing the desired FEC scheme, as shown by block 235.

However, if the comparison performed in block 232 reveals that $E_{primary}$ is less than $E_{FEC}$, then it is desirable for the transmission system 12 to communicate in the backup mode instead of the FEC mode. Thus, if a "yes" determination is made in block 232, the control logic 52 disables the transceiver 44 coupled to the backup line 36 and also disables the FEC module 25 such that the system 12 communicates with the receiving system 17 over primary line 35 without communicating over backup line 36 and without implementing the desired FEC scheme, as shown by block 216.

Note that one reason for $E_{primary}$ to be less than $E_{FEC}$ is that the backup line 36 is significantly degraded due to an abnormal or error condition associated with the backup line 36. Thus, in block 238, the control logic 52 may compare $E_{backup}$ to a threshold error rate ($E_{TH}$). $E_{TH}$ is preferably set such it is desirable for line 36 to be evaluated for an abnormal or error condition if $E_{backup}$ is not less than $E_{TH}$. Moreover, if $E_{backup}$ is indeed not less than $E_{TH}$, then the control logic 52 may transmit a warning message, as shown by block 221.

If $E_{backup}$ is less than $E_{primary}$ in block 228, then the control logic 52 compares $E_{backup}$ to $E_{FEC}$ in block 242. If $E_{backup}$ is not less than $E_{FEC}$, then it is desirable for the transmission system 12 to communicate in the FEC mode instead of the backup mode. Thus, if a "no" determination is made in block 242, the control logic 52 enables both transceivers 41 and 44 and also enables the FEC module 25 such that the system 12 communicates with the receiving system 17 over both lines 35 and 36 while implementing the desired FEC scheme, as shown by block 235.

However, if the comparison performed in block 242 reveals that $E_{backup}$ is less than $E_{FEC}$, then it is desirable for the transmission system 12 to first perform a line switch and then to communicate in the backup mode instead of the FEC mode. Thus, if a "yes" determination is made in block 242, the control logic 52 reverses the designation of the communication lines 35 and 36, as shown by block 244. As an example, assuming that line 35 is designated "primary" and line 36 is designated "backup" prior to block 244, the control logic 52 designates line 36 as "primary" and line 35 as "backup" in block 244. Then, in such an example, the control logic 52 disables the transceiver 41 coupled to the backup line 35 and also disables the FEC module 25 such that the system 12 communicates with the receiving system 17 over primary line 36 without communicating over backup line 35 and without implementing the desired FEC scheme, as shown by block 246.

As shown by block 248, the control logic 52 compares $E_{backup}$ to $E_{TH}$. If $E_{backup}$ is not less than $E_{TH}$, then the control logic 52 transmits a warning message in block 249. In block 252, the control logic 52 determines whether to end the communication session. In this regard, if no further payload data from stream 15 is to be communicated, the process depicted by FIG. 6 ends. However, if there is more payload data from stream 15 to be transmitted to the receiving system 17, then the process depicted by FIG. 6 is repeated.

Figure 6:
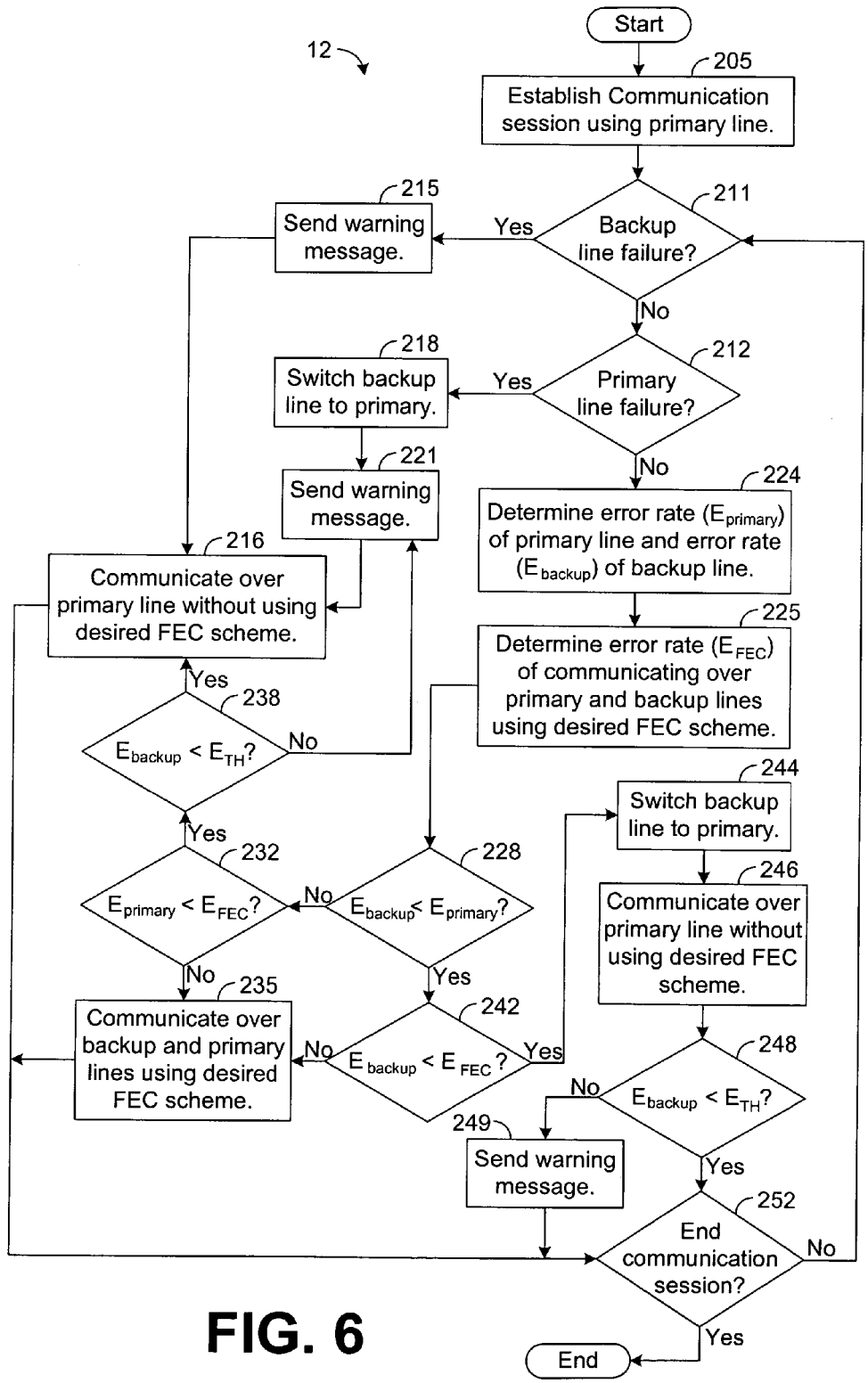
FIG. 6 is a flow chart illustrating an exemplary architecture and functionality of the FEC transmission system depicted in FIG. 1.

Thus, it is possible for the performance of lines 35 and 36 to be sufficient such that the system 12 is placed in the FEC mode in the first pass through the methodology depicted by FIG. 6. However, over time, the performance of one of the lines 35 or 36 may become significantly degraded such that a "yes" determination is made in block 232 or 242 during another pass of the methodology depicted by FIG. 6. In such a situation, the system 12 may switch its mode of operation from the FEC mode to the backup mode and use the line 35 or 36 exhibiting the better performance to communicate with the receiving system 17. If the performance of the degraded line 35 or 36 later improves, then the system 12, in response to a "no" determination in block 232 or 242, may switch its mode of operation such that it again operates in the FEC mode. Moreover, continually repeating the process depicted by FIG. 6 during a communication session between the systems 12 and 17 helps the communication system 10 to dynamically optimize its performance based on changes occurring on the lines 35 and 36.

The invention claimed is:

1. A communication system, comprising:
 a forward error correction (FEC) module configured to receive data and to define FEC code words based on the received data;
 a first transceiver coupled to a first communication line;
 a second transceiver coupled to a second communication line; and
 logic configured to selectively enable the FEC module to implement a desired FEC scheme based on an estimated error rate associated with the first communication line and an estimated error rate associated with the second communication line.

2. The communication system of claim 1, wherein the first transceiver is configured to transmit at least a portion of the data to a remote receiving system, and wherein the logic is configured to enable the second transceiver to transmit a portion of the data to the remote receiving system if the FEC module is enabled to implement the desired FEC scheme.

3. The communication system of claim 1, wherein the control logic is further configured to selectively enable the first and second transceivers to communicate the received data to the receiving system based on the estimated error rates.

4. The communication system of claim 1, wherein the system is configured to operate in a first mode of operation and a second mode of operation based on the estimated error rates, wherein the logic, in the first mode of operation, is configured to disable the FEC module from implementing the desired FEC scheme and to disable the second transceiver from communicating payload data to the receiving system, and wherein the control logic, in the second mode of operation, is configured to enable the FEC module to implement the desired FEC scheme, thereby causing the FEC module to define a plurality of FEC code words based on the payload data, and to enable the first and second transceivers to communicate the plurality of FEC code words to the receiving system.

5. The communication system of claim 1, wherein the error rate associated with the first communication line is independent of the desired FEC scheme, and wherein the error rate associated with the second communication line is based on the desired FEC scheme.

6. A communication system, comprising:
 a forward error correction (FEC) module;
 a first transceiver coupled to a first communication line;
 a second transceiver coupled to a second communication line; and
 logic configured to enable the first transceiver to communicate data from a data stream over the first communication line to a remote receiving system in a first mode of operation, the logic further configured, in a second mode of operation, to enable the FEC module to encode data from the data stream according to a desired FEC scheme and to enable the first and second transceivers to communicate the encoded data over the first and second communication lines, the logic further configured to dynamically switch between the modes of operation based on an estimated error rate associated with at least one of the communication lines, wherein the logic is configured to disable the FEC module from encoding, according to the desired FEC scheme, the data communicated by the first transceiver in the first mode of operation.

7. The communication system of claim 6, wherein the estimated error rate is associated with the first mode of operation, the logic configured to determine an error rate associated with at least one of the communication lines and the second mode of operation, the logic further configured to perform a comparison between the error rates and to determine, based on the comparison, whether to enable the FEC module to encode data from the data stream according to the desired FEC scheme.

8. The communication system of claim 6, wherein the estimated error rate is independent of the desired FEC scheme, the logic configured to determine a first value indicative of the estimated error rate and to determine a second value indicative of an estimated error rate associated with each of the communication lines, the logic further configured to perform a comparison between the first and second values and to select one of the modes of operation based on the comparison.

9. The communication system of claim 8, wherein the estimated error rate associated with each of the communication lines is based on the desired FEC scheme.

10. A transmission system for communicating payload data to a remote receiving system, comprising:
 a forward error correction (FEC) module configured to define FEC code words based on the payload data according to a particular FEC scheme;
 a plurality of transceivers; and
 logic configured to determine a first value indicative of a first error rate associated with communicating the payload data from at least one of the transceivers to the remote receiving system, the logic configured to determine a second value indicative of a second error rate associated with communicating the FEC code words from each of the transceivers to the remote receiving system, the logic further configured to perform a comparison between the first and second values and to selectively enable the FEC module to implement the particular FEC scheme for the payload data based on the comparison.

11. The transmission system of claim 10, wherein the logic is further configured to selectively enable at least one of the transceivers to communicate the payload data based on the comparison.

12. The transmission system of claim 10, wherein the first error rate is associated with communicating the payload data independent of the particular FEC scheme from the at least one transceiver to the receiving system.

13. A method for communicating over first and second communication lines between a transmission system and a receiving system that is remotely located from the transmission system, the method comprising the steps of:
 communicating payload data over the first and second communication lines;
 encoding the payload data according to a particular forward error correction (FEC) scheme;

determining an error rate associated with at least one of the communication lines, wherein the error rate is independent of the particular FEC scheme;

disabling communication of the payload data over the first communication line and disabling the encoding step when the error rate indicates a degraded performance of the first communication line;

detecting an error rate associated with each of the communication lines and based on the particular FEC scheme; and comparing the error rates, wherein the disabling steps are based on the comparing step.

14. A method for communicating over a plurality of communication lines between a transmission system and a receiving system that is remotely located from the transmission system, the method comprising the steps of:

communicating payload data over at least one of the communication lines;

determining a first error rate associated with communicating the payload data over at least one of the communication lines without using a desired FEC scheme;

determining a second error rate associated with communicating the payload data over each of the communication lines using the desired FEC scheme;

encoding the payload data according to the desired FEC scheme; and selectively enabling the encoding step based on the first and second error rates.

15. The method of claim 14, further comprising the step of selectively enabling communication of the payload data over at least one of the communication lines based on the first and second error rates.

16. The method of claim 14, wherein the selectively enabling step comprises the step of enabling the encoding step if the second error rate is less than the first error rate.

17. A method for communicating payload data over a plurality of communication lines between a transmission system and a receiving system that is remotely located from the transmission system, the method comprising the steps of:

transmitting the payload data, in a first mode of operation, over at least one but less than all of the communication lines without using a particular FEC scheme;

transmitting the payload data, in a second mode of operation, over each of the communication lines using the particular FEC scheme;

determining a first value indicative of a transmission error rate associated with the first mode of operation;

determining a second value indicative of a transmission error rate associated with the second mode of operation; and selecting and implementing one of the modes of operation based on the first and second values.

18. The method of claim 17, further comprising the steps of:

monitoring the transmission error rates; and dynamically switching to the non-selected mode of operation based on the monitoring step.

19. The method of claim 17, further comprising the step of comparing the first and second values, wherein the selecting and implementing step is based on the comparing step.

* * * * *